United States Patent
Kang et al.

(10) Patent No.: US 12,191,373 B2
(45) Date of Patent: Jan. 7, 2025

(54) METHOD OF FORMING A SEMICONDUCTOR DEVICE WITH CAPPED AIR-GAP SPACER

(71) Applicant: Samsung Electronics Co., Ltd., Suwon-si (KR)

(72) Inventors: Sangkoo Kang, Yongin-si (KR); Sungsoo Kim, Hwaseong-si (KR); Sunki Min, Seoul (KR); Iksoo Kim, Yongin-si (KR); Donghyun Roh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 469 days.

(21) Appl. No.: 17/526,634

(22) Filed: Nov. 15, 2021

(65) Prior Publication Data

US 2022/0077301 A1  Mar. 10, 2022

Related U.S. Application Data

(63) Continuation of application No. 16/837,329, filed on Apr. 1, 2020, now Pat. No. 11,189,707.

(30) Foreign Application Priority Data

Sep. 30, 2019  (KR) .................. 10-2019-0120719

(51) Int. Cl.
*H01L 29/49*   (2006.01)
*H01L 21/764*  (2006.01)
(Continued)

(52) U.S. Cl.
CPC ........ *H01L 29/4991* (2013.01); *H01L 21/764* (2013.01); *H01L 27/0886* (2013.01);
(Continued)

(58) Field of Classification Search
CPC ............. H01L 29/4991; H01L 29/6656; H01L 29/0886; H01L 29/0673; H01L 29/41733;
(Continued)

(56) References Cited

U.S. PATENT DOCUMENTS 6,410,375 B1  6/2002  Lee
8,421,166 B2  4/2013  Chi et al.
(Continued)

FOREIGN PATENT DOCUMENTS

KR  1020000009098 A  2/2000
KR  1020000056249 A  9/2000
(Continued)

OTHER PUBLICATIONS

Chen, Hsien-Wei , et al., "A self-aligned air gap interconnect process", In 2008 International Interconnect Technology Conference, IEEE, 2008, 34-36.
(Continued)

*Primary Examiner* — Syed I Gheyas
*Assistant Examiner* — Casey Paul Boatman
(74) *Attorney, Agent, or Firm* — Myers Bigel, P.A.

(57) ABSTRACT

A method includes: forming a sacrificial gate structure on the active region; forming a spacer structure including a first spacer, a second spacer, and an air-gap spacer, the air-gap spacer capped by bending an upper portion of the second spacer toward an upper portion of the first spacer; forming an insulating structure on the sides of the spacer structure; forming a gap region; and forming a gate structure including a gate dielectric layer, a gate electrode, and a gate capping layer in the gap region. The upper portion of the second spacer is in physical contact with the upper portion of the first spacer on a contact surface, and a lowermost end of the
(Continued)

contact surface is on a level higher than an upper surface of the gate electrode with the substrate being a reference base level.

20 Claims, 18 Drawing Sheets

(51) Int. Cl.
| | | |
|---|---|---|
| H01L 27/088 | (2006.01) | |
| H01L 29/06 | (2006.01) | |
| H01L 29/417 | (2006.01) | |
| H01L 29/423 | (2006.01) | |
| H01L 29/66 | (2006.01) | |
| H01L 29/78 | (2006.01) | |
| H01L 29/786 | (2006.01) | |

(52) U.S. Cl.
CPC .... *H01L 29/0673* (2013.01); *H01L 29/41733* (2013.01); *H01L 29/41791* (2013.01); *H01L 29/42392* (2013.01); *H01L 29/4908* (2013.01); *H01L 29/66545* (2013.01); *H01L 29/6656* (2013.01); *H01L 29/66795* (2013.01); *H01L 29/7851* (2013.01); *H01L 29/78696* (2013.01)

(58) Field of Classification Search
CPC ......... H01L 29/41791; H01L 29/42392; H01L 29/66545; H01L 29/6653; H01L 21/764; H01L 27/0886
See application file for complete search history.

(56) References Cited

U.S. PATENT DOCUMENTS

| 8,637,384 B2 | 1/2014 | Ando et al. |
|---|---|---|
| 9,117,805 B2 | 8/2015 | Niebojewski et al. |
| 9,472,644 B2 | 10/2016 | Sung |
| 10,204,999 B2 | 2/2019 | Lee et al. |
| 2005/0037585 A1 | 2/2005 | Park et al. |
| 2006/0065939 A1 | 3/2006 | Doczy et al. |
| 2012/0086048 A1 | 4/2012 | Park et al. |
| 2012/0168899 A1 | 7/2012 | Kim et al. |
| 2012/0276711 A1 | 11/2012 | Yoon et al. |
| 2014/0087535 A1 | 3/2014 | Roh et al. |
| 2015/0108544 A1 | 4/2015 | Ching et al. |
| 2015/0228754 A1* | 8/2015 | Sung ................ H01L 21/76224 438/595 |
| 2016/0163816 A1 | 6/2016 | Yu et al. |
| 2016/0181143 A1 | 6/2016 | Kwon et al. |
| 2016/0365426 A1* | 12/2016 | Ching ................ H01L 29/6653 |
| 2017/0110554 A1 | 4/2017 | Tak et al. |
| 2017/0352657 A1* | 12/2017 | Bergendahl ..... H01L 21/823468 |
| 2018/0138280 A1 | 5/2018 | Li et al. |
| 2018/0166319 A1 | 6/2018 | Park et al. |
| 2018/0166553 A1 | 6/2018 | Lee et al. |
| 2018/0182845 A1 | 6/2018 | Seong et al. |
| 2019/0123051 A1 | 4/2019 | Park |
| 2019/0334008 A1 | 10/2019 | Chen et al. |
| 2020/0020567 A1* | 1/2020 | Sun ................ H01L 21/31053 |
| 2020/0020776 A1 | 1/2020 | Yang et al. |
| 2020/0052088 A1 | 2/2020 | Frougier et al. |

FOREIGN PATENT DOCUMENTS

| KR | 100518398 B1 | 9/2005 |
|---|---|---|
| KR | 100746201 B1 | 8/2007 |
| KR | 101078255 B1 | 10/2011 |
| KR | 1020120036185 A | 4/2012 |
| KR | 1020120121795 A | 11/2012 |
| KR | 101322872 B1 | 10/2013 |
| KR | 1020140138049 A | 12/2014 |
| KR | 1020150044804 A | 4/2015 |
| KR | 1020150045782 A | 4/2015 |
| KR | 1020170044525 A | 4/2017 |
| KR | 1020180073789 A | 7/2018 |

OTHER PUBLICATIONS

Cheng, K., et al., "Air spacer for 10nm FinFET CMOS and beyond", 2016 IEEE International Electron Devices Meeting (IEDM), 2016, 17.1.1-17.1.4.

Noguchi, Junji, et al., "Process and reliability of air-gap Cu interconnect using 90-nm node technology", IEEE Transactions on Electron Devices, 52(3), 2005, 352-359.

Tsukamoto, K., et al., "An Advanced Air Gap Process for MLC flash memories reducing Vth interference and realizing high reliability", In Extended abstracts of the . . . Conference on Solid State Devices and Materials (vol. 2006), 2006, 294-295.

Korean Office Action corresponding to KR 10-2019-0120719; issued Oct. 14, 2024, (7 pages).

* cited by examiner

METHOD OF FORMING A SEMICONDUCTOR DEVICE WITH CAPPED AIR-GAP SPACER

CROSS-REFERENCE TO RELATED APPLICATION(S)

This application is a continuation of U.S. patent application Ser. No. 16/837,329, filed Apr. 1, 2020, which claims benefit of priority to Korean Patent Application No. 10-2019-0120719 filed on Sep. 30, 2019, in the Korean Intellectual Property Office, the disclosure of which is incorporated herein by reference in its entirety.

BACKGROUND

Example embodiments of the present inventive concept relate to semiconductor devices and, more particularly, to FinFet semiconductor devices.

As demand for high performance, high speed, and/or multifunctionality of semiconductor devices has increased, integration density of semiconductor devices has also increased. In accordance with the trend of higher integration densities in semiconductor devices, the semiconductor devices have been manufactured with patterns having generally fine widths or spacing distances therebetween. Also, to overcome a limitation in operation properties caused by reducing a size of a planar metal oxide semiconductor FET (MOSFET), there has been a great volume of research devoted to developing a semiconductor device including a FinFET with a three-dimensional channel.

SUMMARY

Example embodiments of the present inventive concept may provide a semiconductor device having improved electrical properties.

According to some example embodiments of the present inventive concept, a semiconductor device includes a substrate including an active region extending in a first direction; a gate structure intersecting the active region and extending in a second direction on the substrate, the gate structure including a gate electrode, a gate capping layer on the gate electrode, and a plurality of spacers on side surfaces of the gate electrode: source/drain regions on the active region on at least one side of the gate structure; a first insulating layer and a second insulating layer disposed on the source/drain regions on at least one side of the gate structure; and contact plugs on the source/rain regions and penetrating the first and second insulating layers. The plurality of spacers includes a first spacer on the side surfaces of the gate electrode, an air-gap spacer on an external side surface of the first spacer, and a second spacer on an external side surface of the air-gap spacer. An upper portion of the second spacer is bent towards an upper portion of the first spacer to cap the air-gap spacer.

According to some example embodiments of the present inventive concept, a semiconductor device includes a gate electrode on a substrate; a plurality of spacers on side surfaces of the gate electrode; and a first insulating layer and a second insulating layer on an external side surface of the plurality of spacers. The plurality of spacers include a first spacer on each of the side surfaces of the gate electrode, an air-gap spacer on an external side surface of the first spacer, and a second spacer on an external side surface of the air-gap spacer. The air-gap spacer is an empty space surrounded by the first and second spacers and the substrate. The first insulating layer and the second insulating layer have different properties.

According to some example embodiments of the present inventive concept, a semiconductor device includes a substrate including an active region extending in a first direction; a gate electrode intersecting the active region and extending in a second direction on the substrate; a gate capping layer on an upper surface of the gate electrode; a plurality of spacers on side surfaces of the gate electrode and including an air-gap spacer; and a first insulating layer and a second insulating layer in physical contact with an outermost spacer of the plurality of spacers. At least one of the plurality of spacers is bent towards the gate electrode and is configured to seal the air-gap spacer, and an upper surface of the second insulating layer is on a level substantially the same as that of upper surfaces of the plurality of spacers.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
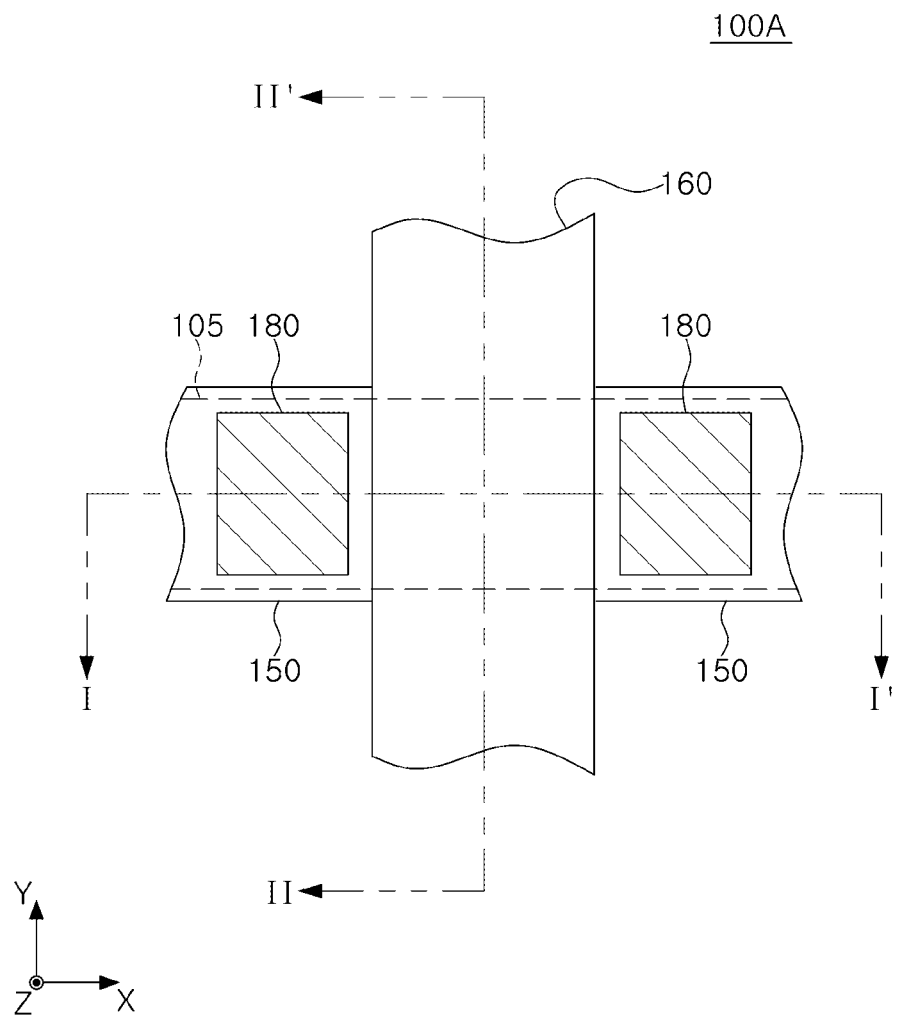
FIG. 1 is a plan diagram illustrating a semiconductor device according to example embodiments of the present inventive concept.

Example embodiments of the inventive concepts will now be described more fully with reference to the accompanying drawings, in which example embodiments are shown. The same reference numerals or the same reference designators may denote the same elements or components throughout the specification.

As used herein, the term "and/or" includes any and all combinations of one or more of the associated listed items. It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination.

FIG. 1 is a plan diagram illustrating a semiconductor device according to an example embodiment.

Figure 2A:
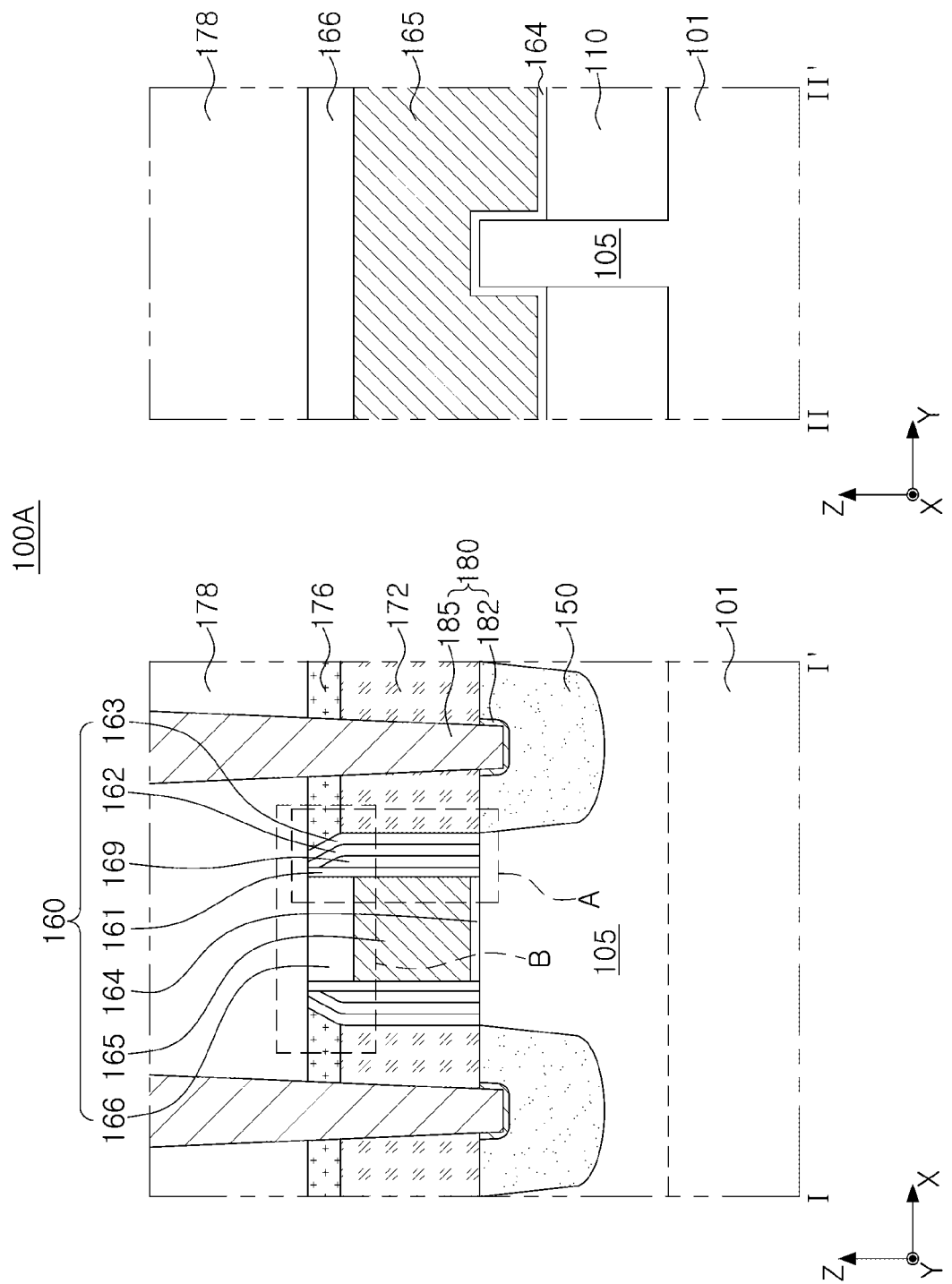
FIG. 2A is a cross-sectional diagram illustrating a semiconductor device according to example embodiments of the present inventive concept.
Figure 2B:
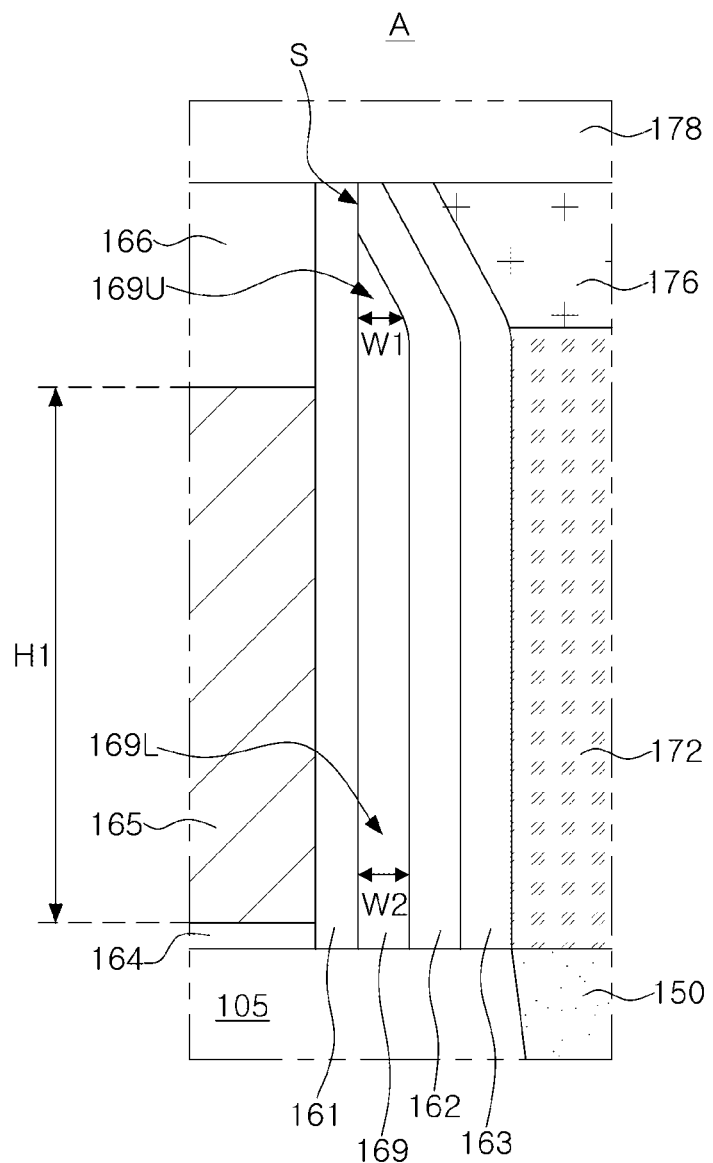
FIGS. 2B and 2C are enlarged diagrams illustrating a portion of a semiconductor device according to example embodiments of the present inventive concept.

FIG. 2A is a cross-sectional diagram illustrating a semiconductor device taken along lines I-I' and II-II' of FIG. 1 according to an example embodiment. FIG. 2B is an enlarged diagram illustrating region A in FIG. 2A.

Referring to FIGS. 1 to 2B, a semiconductor device 100A may include a substrate 101, an active region 105 on the substrate 101, source/drain regions 150 on the active region 105, a gate structure 160 intersecting the active region 105 and extending thereacross, and contact patterns 180 connected to the source/drain regions 150. The semiconductor device 100A may further include device separation layers 110, a first insulating layer 172, a second insulating layer 176, and a third insulating layer 178. The gate structure 160 may include a gate dielectric layer 164, a gate electrode 165, a gate capping layer 166, and a plurality of spacers.

A fin-type transistor (FinFET) including a fin-type channel region is illustrated as an example embodiment of the inventive concept, but example embodiments thereof are not limited thereto. Semiconductor devices in the example embodiments may include, but are not limited to, a tunneling field effect transistor (tunneling FET), a transistor including a nanowire, a transistor including a nanosheet (multi bridge channel FET, (MBCFET™)) or a three-dimensional (3D) transistor.

The substrate 101 may have an upper surface extending in an x direction and a y direction. The substrate 101 may include, for example, a group IV semiconductor, a group III-V compound semiconductor, and/or a group II-VI compound semiconductor. For example, a group IV semiconductor may include one or more of silicon, germanium, silicon-gallium, or the like. The substrate 101 may be provided as a bulk wafer, an epitaxial layer, a silicon on insulator layer (SOI), or a semiconductor on insulator layer (SeOI), or the like.

The device separation layer 110 may define the active region 105 on the substrate 101. For example, the device separation layer 110 may be formed by using a shallow trench isolation (STI) process. In example embodiments, the device separation layer 110 may further include a region having a stepped portion and extending to a lower portion of the substrate 101. The device separation layer 110 may partially expose an upper portion of the active region 105. In example embodiments, the device separation layer 110 may have a curved upper surface having a higher level (relative to the substrate 101 being a base reference level) towards the active region 105. The device separation layer 110 may be formed of an insulating material. For example, the device separation layer 110 may be formed of an oxide, a nitride, or a combination thereof.

The active region 105 may be defined by the device separation layers 110 in the substrate 101, and may extend in a first direction, the x direction, for example. The active region 105 may be configured to protrude from the substrate 101. An upper end of the active region 105 may be configured to protrude at a defined height from an upper surface of the device separation layers 110. The active region 105 may be configured as a portion of the substrate 101, or may include an epitaxial layer grown from the substrate 101. A portion of the active region 105 on the substrate 101 may be recessed on both sides of the gate structure 160, and the source/drain regions 150 may be disposed on the recessed active region 105. The active region 105 may include impurities or doping regions including impurities.

The source/drain regions 150 may be disposed on the active region 105 on both sides of the gate structure 160. The source/drain regions 150 may be provided as a source region or a drain region of the semiconductor device 100A. A height of an upper surface of each of the source/drain regions 150 (relative to the substrate 101 being a base reference level) may be the same as a height of an uppermost end of the active region 105 (relative to the substrate 101 being a base reference level), but example embodiments thereof are not limited thereto. A height of an upper surface of each of the source/drain regions 150 (relative to the substrate 101 being a base reference level) may vary in example embodiments. In another example embodiment, each of the source/drain regions 150 may have an elevated form in which an upper surface thereof is disposed on a level higher than a lower surface of the gate electrode 165 (relative to the substrate 101 being a base reference level), but example embodiments thereof are not limited thereto. In an example embodiment, each of the source/drain regions 150 may have a width decreasing from an upper portion to a lower portion, and a lower surface of each of the source/drain regions 150 may have a "U"-shape. However, example embodiments thereof are not limited thereto, and the source/drain regions 150 may have various other shapes. For example, each of the source/drain regions 150 may have a polygonal shape or a circular shape.

The source/drain regions 150 may include silicon or silicon germanium (SiGe). The source/drain regions 150 may be formed of epitaxial layers. For example, when the source/drain regions 150 include silicon-gallium (SiGe), the source/drain regions 150 may apply stress to a channel region of the semiconductor device 100A, one region of the active region 105 formed of silicon (Si), such that mobility of a hole may improve. In example embodiments, the source/drain regions 150 may include a plurality of regions including elements and/or doped elements having different concentrations.

The gate structure 160 may intersect the active region 105 and may extend in one direction, the y direction, for example, in an upper portion of the active region 105. Channel regions of transistors may be formed in the active region 105 intersecting the gate structure 160. The gate structure 160 may include a gate dielectric layer 164, a gate electrode 165 on the gate dielectric layer 164, a gate capping layer 166 on the gate electrode 165, and a plurality of spacers on a side surface of the gate electrode 165. The plurality of spacers may include a first spacer 161 on each side surface of the gate electrode 165, an air-gap spacer 169 on an external side surface of the first spacer 161, a second spacer 162 on an external side surface of the air-gap spacer 169, and a third spacer 163 on an external side surface of the second spacer 162.

The gate dielectric layer 164 may be disposed between the active region 105 and the gate electrode 165. In an example embodiment, the gate dielectric layer 164 may only be disposed on a lower surface of the gate electrode 165 with other surface areas of the gate electrode 165 being free of the gate dielectric layer 164, but example embodiments thereof are not limited thereto. The gate dielectric layer 164 may be on and at least partially cover a lower surface and both side surfaces of the gate electrode 165. The gate dielectric layer 164 may include an oxide, a nitride, and/or a high-k material. The high-k material may refer to a dielectric material having a dielectric constant higher than a silicon oxide film ($SiO_2$). Examples of high-k materials may include, but are not limited to, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$), for example.

The gate electrode 165 may be disposed in an upper portion of the active region 105, and may have a line form extending in the y direction. The gate electrode 165 may have a first height H1 (see FIG. 2B) from the gate dielectric layer 164 to the gate capping layer 166. The first height H1 may be configured to be lower than or not to extend to a point at which the second spacer 162 is bent. The gate electrode 165 may include a conductive material. For example, the gate electrode 165 may include one or more metal nitride materials, such as, but not limited to, a titanium nitride film (TiN), a tantalum nitride film (TaN), and a tungsten nitride film (WN), and/or one or more metal materials such as, but not limited to, aluminum (Al), tungsten (W), molybdenum (Mo), and the like, and/or one or more semiconductor materials, such as, but not limited to, a doped polysilicon. The gate electrode 165 may include multiple layers, i.e., two or more layers. The gate electrodes 165 may be separated from each other by a separation portion between at least some of adjacent transistors in accordance with the example configuration of the semiconductor device 100A.

The gate capping layer 166 may be disposed in an upper portion of the gate electrode 165, and a lower surface and side surfaces thereof may be surrounded by the gate electrode 165 and the plurality of spacers 161, 162, 163, and 169. The gate capping layer 166 may include a material having tensile stress. Tensile stress of the gate capping layer 166 will be described below with reference to FIG. 2C.

The plurality of spacers 161, 162, 163, and 169 may be disposed on both side surfaces of the gate electrode 165. The plurality of spacers 161, 162, 163, and 169 may insulate the source/drain regions 150 and the gate electrode 165 from each other. In example embodiments, the plurality of spacers 161, 162, 163, and 169 may further include one or more other spacers in addition to the first spacer 161, the second spacer 162, the third spacer 163, and the air-gap spacer 169.

The first spacer 161 may be disposed between the gate electrode 165 and the air-gap spacer 169, the second spacer 162 may be disposed between the air-gap spacer 169 and the third spacer 163, and the third spacer 163 may be disposed between the second spacer 162 and the first insulating layer 172. Each of the first to third spacers 161, 162, and 163 may have a line form extending in the y direction. In an example embodiment, each of the first to third spacers 161, 162, and 163 may have a width increasing from an upper portion to a lower portion. A width of each of the first to third spacers 161, 162, and 163 may be 100 Å or less, but example embodiments thereof are not limited thereto.

The first to third spacers 161, 162, and 163 may be formed of an oxide, a nitride, and/or an oxide nitride, and may be configured as a multilayer film. The first to third spacers 161, 162, and 163 may include a low-k material. For example, the first to third spacers 161, 162, and 163 may include SiC, SiN, SiO, SiCN, SiOC, and/or SiOCN. In another example embodiment, at least one of the first to third spacers 161, 162, and 163 may include one or more of a polyimide, a polyarylene ether (PAE), SiLK™, hydrogen silsesquioxane (HSQ), methyl silsesquioxane (MSQ), Black Diamond™, fluorine-doped silicate glass (FSG), hydrogen silsesquioxane (HSQ), methyl silsesquioxane (MSQ), and the like. As the first to third spacers 161, 162, and 163 may include a low-k material, capacitance between the gate electrode 165 and contact plugs 185 may decrease.

The air-gap spacer 169 may be defined as an empty space surrounded by the first spacer 161, the second spacer 162, and the active region 105. The air-gap spacer 169 may have a spacer shape. The air-gap spacer 169 may be disposed between the first spacer 161 and the second spacer 162, and may have a line form extending in the y direction. In example embodiments, the air-gap spacer 169 may be defined as an empty space surrounded by the first spacer 161, the second spacer 162, and the substrate 101.

An upper portion of the second spacer 162 may be bent towards an upper portion of the first spacer 161 to cap and seal the air-gap spacer 169. An upper portion of the third spacer 163 may be bent towards the upper portion of the first spacer 161 to conform to a shape of the upper portion of the second spacer 162. The upper portion of the second spacer 162 may be in physical contact with the upper portion of the first spacer 161 on a contact surface S. A lowermost end of the contact surface S may be disposed on a level higher than an upper surface of the gate electrode 165 (relative to the substrate 101 being a base reference level). In an example embodiment, the contact surface S may include a first contact surface and a second contact surface on both sides of the gate electrode 165, for example, and the first and second contact surfaces may be disposed on different levels from a lower surface of the gate electrode 165 (relative to the substrate 101 being a base reference level).

A first width W1 of an upper portion 169U of the air-gap spacer 169 may be less than a second width W2 of a lower portion 169L, and a width of the air-gap spacer 169 may have a value within a range of approximately 40 Å to 60 Å. The upper portion 169U of the air-gap spacer 169 may have a shape bent towards the gate electrode 165. In an example embodiment, a shape of the air-gap spacer 169 is not limited to the example illustrated in the diagram, and when the upper portion 169U of the air-gap spacer 169 is capped by the first and second spacers 161 and 162, a shape of the air-gap spacer 169 below the capped region may vary. For example, the air-gap spacer 169 may have a width increasing from an upper portion to a lower portion, or may have a minimum width in an upper portion and a maximum width in a middle portion, but example embodiments thereof are not limited thereto.

In example embodiments, as the semiconductor device 100A includes the air-gap spacer 169 between the first spacer 161 and the second spacer 162, electrical insulating properties of the gate structure 160 may improve. Particularly, parasitic capacitance may be reduced, and, accordingly, operation speed of the semiconductor device may increase.

The first insulating layer 172 may be on and at least partially cover the source/drain regions 150, and may be on and at least partially cover the device separation layer 110 in a region not illustrated. The first insulating layer 172 may be disposed on at least one side of the gate structure 160, and may be in physical contact with an outermost spacer of the plurality of spacers. The first insulating layer 172 may include an oxide, a nitride, and/or an oxide nitride, and may include a low-k material.

The second insulating layer 176 may be disposed on the first insulating layer 172, may be disposed on at least one side of the gate structure 160, and may be in physical contact with an outermost space of the plurality of spacers. An upper surface of the second insulating layer 176 may be disposed on a level substantially the same as that of upper surfaces of the plurality of spacers (relative to the substrate 101 being a base reference level). An upper surface of the second insulating layer 176 may be coplanar with an upper surface of the first spacer 161, an upper surface of the second spacer 162, an upper surface of the third spacer 163, and an upper surface of the gate capping layer 166. The second insulating layer 176 may include an oxide, a nitride, and/or an oxide nitride, and may include a low-k material.

The first and second insulating layers 172 and 176 may have different properties. In an example embodiment, the second insulating layer 176 may have a density greater than that of the first insulating layer 172. For example, the second insulating layer 176 may include a silicon oxide having a density greater than a density of the first insulating layer 172. In an example embodiment, the first and second insulating layers 172 and 176 may include a silicon oxide, and the first insulating layer 172 may also include one or more of SiH, SiC, or the like, such that the first insulating layer 172 may have an oxygen atomic fraction less than that of the second insulating layer 176.

The third insulating layer 178 may be on and at least partially cover the first to third spacers 161, 162, and 163, the gate capping layer 166, and the second insulating layer 176. The third insulating layer 178 may include an oxide, a nitride, and/or an oxide nitride, and may include a low-k material.

The contact patterns 180 may include a metal semiconductor film 182 and contact plugs 185. The metal semiconductor film 182 may be disposed between the source/drain regions 150 and the contact plugs 185. The metal semiconductor film 182 may include a metal silicide, a metal germanide, and/or a metal silicide-germanide, and the metal may comprise titanium (Ti), nickel (Ni), tantalum (Ta), cobalt (Co), and/or tungsten (W). The contact plugs 185 may penetrate the first to third insulating layers 172, 176, and 178, may be connected to the source/drain regions 150, and may apply an electrical signal to the source/drain regions 150. The contact plugs 185 may be disposed on the source/drain regions 150 as illustrated in FIG. 1, and in example embodiments, the contact plugs 185 may have a length longer than a length of each of the source/drain regions 150 in the y direction. The contact plugs 185 may have inclined side surfaces, a width of a lower portion of which is narrower than a width of an upper portion, in accordance with an aspect ratio, but example embodiments thereof are not limited thereto. The contact plugs 185 may be in contact with the source/drain regions 150 by recessing a portion of the source/drain regions 150, and a depth of the recessed portion may vary in example embodiments. In example embodiments, a lower surface of each of the contact plugs 185 may extend downwardly farther than an upper surface of the active region 105. Alternatively, in example embodiments, the contact plugs 185 may be in physical contact with an upper surface of the source/drain region 150 without recessing the source/drain region 150. The contact plugs 185 may include one or more metal nitride materials, such as, but not limited to, a titanium nitride film (TiN), a tantalum nitride film (TaN), and/or a tungsten nitride fiml (WN), and/or a metal material, such as, but not limited to, aluminum (Al), tungsten (W), and/or molybdenum (Mo).

Figure 2C:
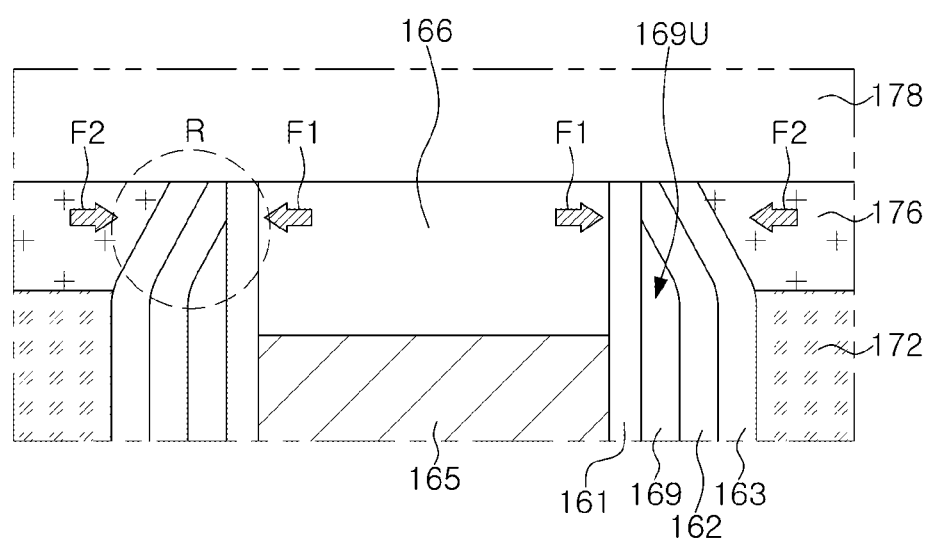

FIG. 2C is an enlarged diagram illustrating a portion of a semiconductor device, denoted as region B in FIG. 2A, according to an example embodiment. FIG. 2C is a diagram illustrating stress applied to a plurality of spacers 161, 162, 163, and 169 between a gate capping layer 166 and a second insulating layer 176.

Referring to FIG. 2C, the plurality of spacers 161, 162, 163, and 169 may form a capping region R between the gate capping layer 166 and the second insulating layer 176. The gate capping layer 166 and the second insulating layer 176 may have tensile stress to apply compressive stress to the plurality of spacers 161, 162, 163, and 169. The "tensile stress" may refer to stress pushing the plurality of spacers 161, 162, 163, and 169 in a first force F1 direction by the gate capping layer 166 or stress pushing the plurality of spacers 161, 162, 163, and 169 in a second force F2 direction by the second insulating layer 176. For example, the gate capping layer 166 may include nitride having tensile stress, and may push the first spacer 161 in the direction of the first force F1. The second insulating layer 176 may include silicon oxide having high density and tensile stress, and may push the third spacer 136 in the direction of the second force F2. Due to the second insulating layer 176, the second and third spacers 162 and 163 may maintain a bent structure, which is bent towards the first spacer 161.

In example embodiments, due to the stress relationship, shapes of the plurality of spacers 161, 162, 163, and 169 or the shape of the gate capping layer 166 may partially change in a capping region R. For example, one surface of the first spacer 161 in contact with the gate capping layer 166 may have a rounded shape, curved inwardly towards the air-gap spacer 169, but example embodiments thereof are not limited thereto.

Through the first force F1 of the gate capping layer 166 and the second force F2 of the second insulating layer 176, compressive stress may be applied to the plurality of spacers 161, 162, 163, and 169. In example embodiments, compressive stress may be applied to the first to third spacers 161, 162, and 163 so as not to externally expose an upper portion 169U of the air-gap spacer 169 capped by the first to third spacers 161, 162, and 163, such that capping stability of the air-gap spacer 169 may improve. Accordingly, a structure of the capping region R of the air-gap spacer 169 may be maintained, such that insulating properties of the spacers may improve, and a semiconductor device having improved electrical properties may be provided.

Figure 3:
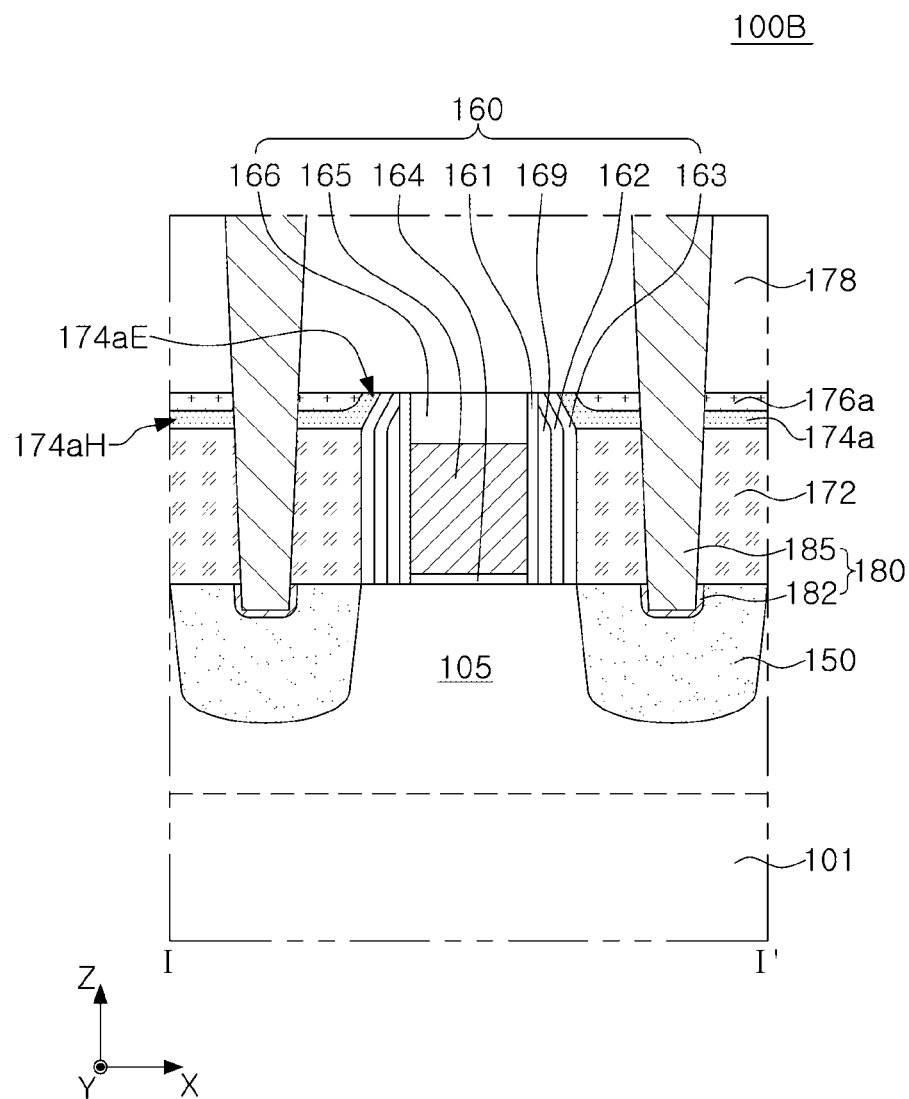
FIG. 3 is a cross-sectional diagram illustrating a semiconductor device according to example embodiments of the present inventive concept.

FIG. 3 is a cross-sectional diagram illustrating a semiconductor device taken along line I-I' of FIG. 1 according to an example embodiment.

Referring to FIG. 3, a semiconductor device 100B may further include a liner layer 174a between a first insulating layer 172 and a second insulating layer 176a. The liner layer 174a may be disposed on at least one side of a gate structure 160, and may be in physical contact with an outermost spacer of the plurality of spacers. The liner layer 174a may also be disposed adjacent to a region in which an air-gap spacer 169 is capped by second and third spacers 162 and 163. An uppermost portion of the liner layer 174a may be disposed on a level substantially the same as that of an upper portion of the plurality of spacers (relative to the substrate 101 being a base reference level). An uppermost surface of the liner layer 174a may be substantially coplanar with an upper surface of the first spacer 161, an upper surface of the second spacer 162, an upper surface of the third spacer 163, an upper surface of the gate capping layer 166, and an upper surface of the second insulating layer 176a.

The liner layer 174a may include a horizontal portion 174aH in parallel to an upper surface of a substrate 101, and an extended portion 174aE connected to the horizontal portion 174aH and bent towards the gate electrode 165. Contact plugs 185 may penetrate the second insulating layer 176a, the horizontal portion 174aH of the liner layer 174a, and the first insulating layer 172 and may be in physical contact with the source/drain regions 150. The extended portion 174aE may be in physical contact with an external side surface of the third spacer 163.

The liner layer 174a may apply compressive stress to the first to third spacers 161, 162, and 163 along with the second insulating layer 176 and may maintain a structure of the air-gap spacer 169, such that the liner layer 174a may improve capping stability. The liner layer 174a may be comprise an oxide, a nitride, and/or an oxide nitride, and may include a low-k material. For example, the liner layer 174a may include SiC, SiN, SiO, SiCN, SiOC, and/or SiOCN. The liner layer 174a may not be limited to these example embodiments, but may also be implemented and/or used in other example embodiments.

Figure 4:
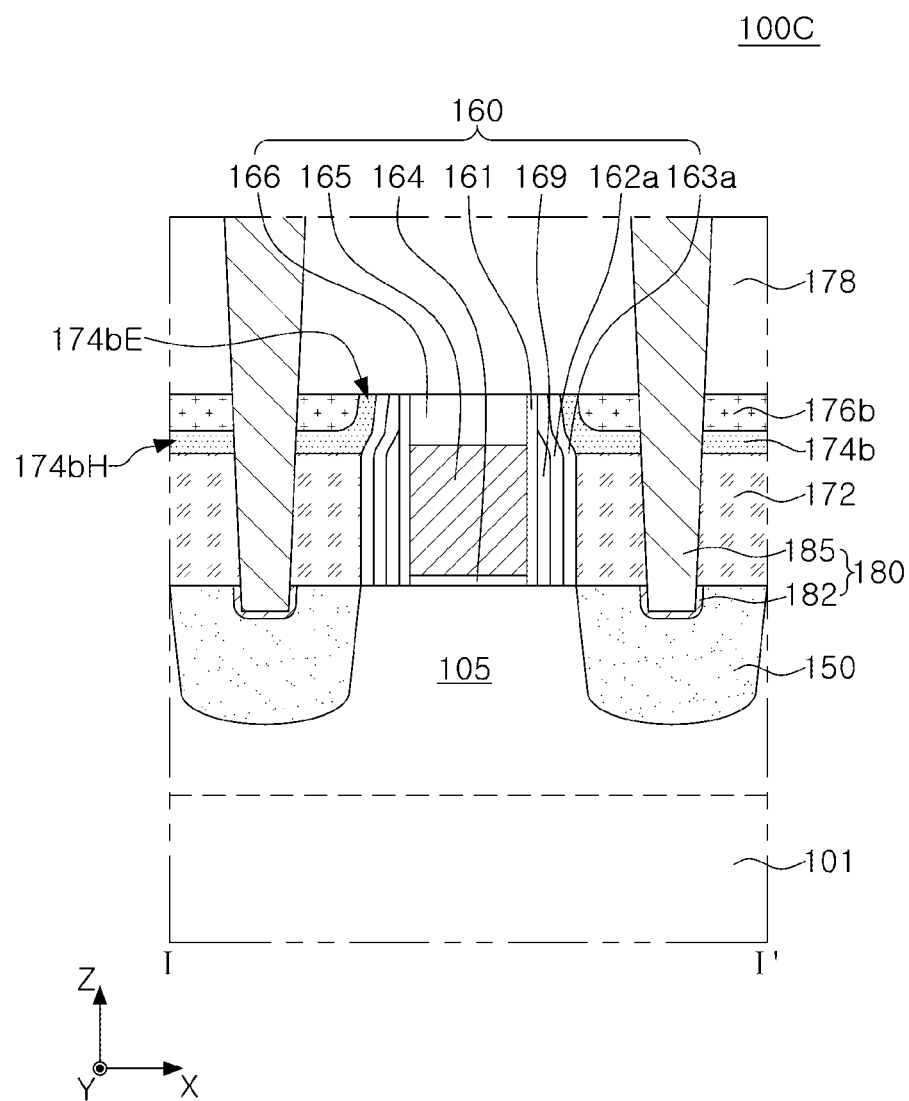
FIG. 4 is a cross-sectional diagram illustrating a semiconductor device according to example embodiments of the present inventive concept.

FIG. 4 is a cross-sectional diagram illustrating a semiconductor device taken along line I-I' of FIG. 1 according to an example embodiment.

Referring to FIG. 4, second and third spacers 162a and 163a of a semiconductor device 100C may cap an air-gap spacer 169 and may have a shape extending farther in a z direction, and the semiconductor device 100C may include a liner layer 174b between a first insulating layer 172 and a second insulating layer 176b. The air-gap spacer 169 may be disposed on a relatively lower level with reference to the second insulating layer 176b in the cross-sectional view of FIG. 4, differently from some other example embodiments. A second spacer 162a may further extend in a z direction along an external side surface of the first spacer 161 from a portion in which the second spacer 162a is in contact with the first spacer 161. A third spacer 163a may further extend in the z direction along an external side surface of the second spacer 162a. As a contact area between the second spacer 162a and the first spacer 161 is greater than in some other example embodiments, and as a contact area between the third spacer 163a and the liner layer 174b is greater than in some other example embodiments, capping stability of the air-gap spacer 169 by compressive stress may improve.

A relative height of each of the second spacer 162a, the third spacer 163a, and the air-gap spacer 169 may vary in example embodiments. For example, a ratio between a length of one surface on which the second spacer 162a is in contact with the first spacer 161a in the z direction and a height of the air-gap spacer 169 may vary in example embodiments.

The liner layer 174b may include a horizontal portion 174bH in parallel to an upper surface of the substrate 101, and an extended portion 174bE connected to the horizontal portion 174bH and bent towards the gate electrode 165. The extended portion 174bE may further extend along an external side surface of the third spacer 163a from a portion in which the extended portion 174bE is in contact with the third spacer 163a. Further description of the liner layer 174b may be omitted in view of the above description of the liner layer 174a with reference to FIG. 3.

Figure 5:
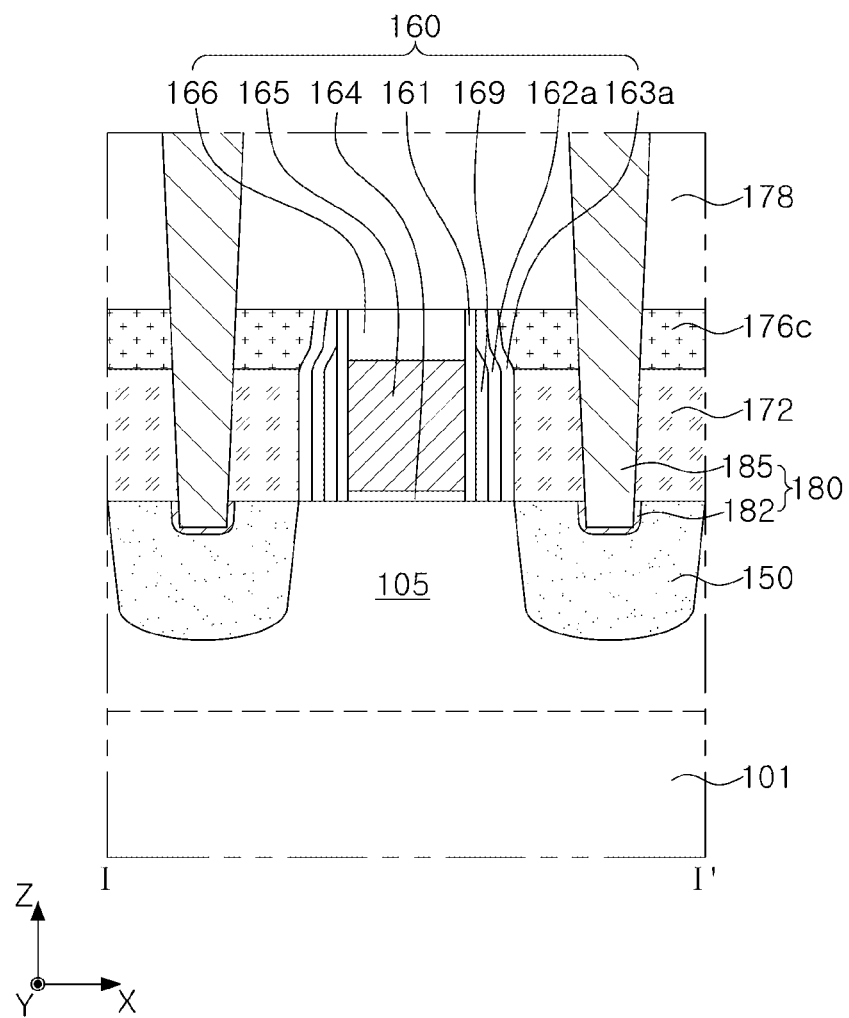
FIG. 5 is a cross-sectional diagram illustrating a semiconductor device according to example embodiments of the present inventive concept.

FIG. 5 is a cross-sectional diagram illustrating a semiconductor device taken along line I-I' of FIG. 1 according to an example embodiment.

Referring to FIG. 5, second and third spacers 162a and 163a of a semiconductor device 100D may cap an air-gap spacer 169 and may have a shape further extending in the z direction. The second spacer 162a may further extend in the z direction along an external side surface of the first spacer 161 from a portion in which the second spacer 162a is in contact with the first spacer 161. The third spacer 163a may further extend in the z direction along an external side surface of the second spacer 162a. As the second and third spacers 162a and 163a further extend in the z direction, the second insulating layer 176c may have a greater thickness in the z direction, in contrast with the example illustrated in FIG. 2A. The second insulating layer 176c may apply compressive stress to the first to third spacers 161, 162, and 163 and may maintain a structure of the air-gap spacer 169, such that capping stability may improve. As a contact area between the second spacer 162a and the first spacer 161 may be greater than in some other example embodiments, and as a contact area between the third spacer 163a and the second insulating layer 176c may be greater than in some other example embodiments, capping stability of the air-gap spacer 169 may improve.

Figure 6:
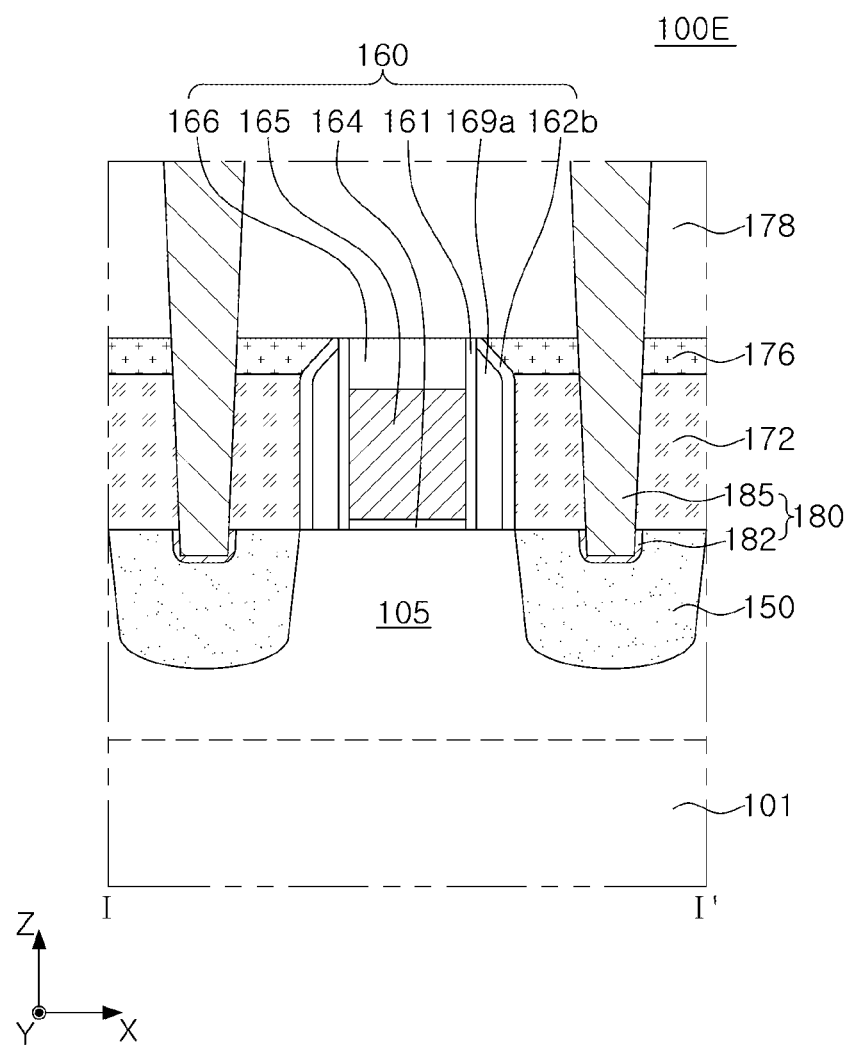
FIG. 6 is a cross-sectional diagram illustrating a semiconductor device according to example embodiments of the present inventive concept.

FIG. 6 is a cross-sectional diagram illustrating a semiconductor device taken along line I-I' of FIG. 1 according to an example embodiment.

Referring to FIG. 6, in a semiconductor device 100E, a plurality of spacers may include a first spacer 161, a second spacer 162b, and an air-gap spacer 169a, and an outermost spacer of the plurality of spacers may be the second spacer 162b. Thus, in contrast with the example embodiments of FIG. 2A, the plurality of spacers may not include a third spacer 163. The air-gap spacer 169a may have a relatively wide width, and insulating properties of the spacer may improve, such that a semiconductor device having improved electrical properties may be provided.

In another example embodiment, liner layers 174a and 174b may also be disposed between the first insulating layer 172 and the second insulating layer 176, similar to the example embodiments of FIGS. 3 and 4, such that capping stability of the air-gap spacer 169a may improve.

Figure 7:
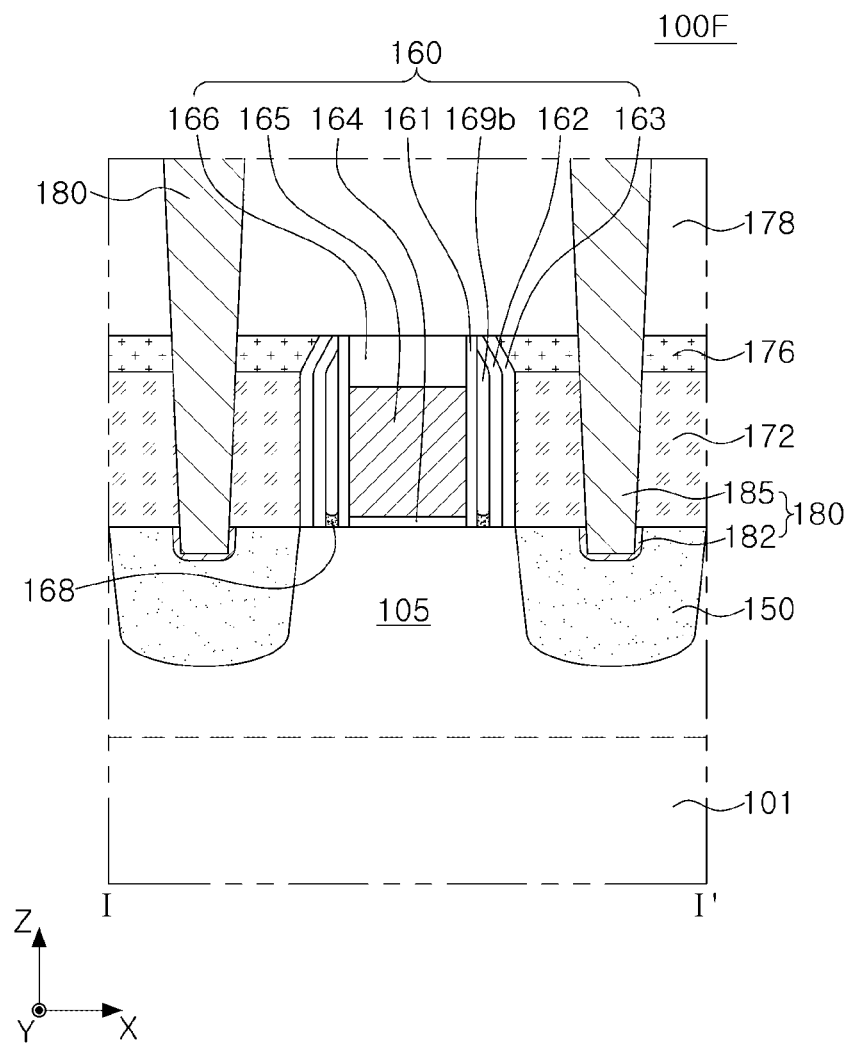
FIG. 7 is a cross-sectional diagram illustrating a semiconductor device according to an example embodiment of the present inventive concept.

FIG. 7 is a cross-sectional diagram illustrating a semiconductor device taken along line I-I' of FIG. 1 according to an example embodiment.

Referring to FIG. 7, a semiconductor device 100F may further include a lower sacrificial spacer layer 168 disposed in a lower portion of an air-gap spacer 169b. The lower sacrificial spacer layer 168 of a sacrificial spacer 268 (see FIG. 9) may not be etched by an etching process, which will be described with reference to FIG. 10B, and may remain. The air-gap spacer 169b may be configured as an empty space surrounded by the first and second spacers 161 and 162 and the lower sacrificial spacer layer 168. The lower sacrificial spacer layer 168 may be in physical contact with a lower portion of the first spacer 161 and a lower portion of the second spacer 162, and a central portion of the lower sacrificial spacer layer 168 may have a rounded shape, curved inwardly towards a substrate 101, but example embodiments thereof are not limited thereto.

In the example embodiment, the lower sacrificial spacer layer 168 may be disposed on a level lower than the first insulating layer 172 (relative to the substrate 101 being a base reference level), but example embodiments thereof are not limited thereto. In example embodiments, an uppermost end of the lower sacrificial spacer layer 168 in physical contact with the first spacer 161 or the second spacer 162b may be disposed on a level higher than a lower surface of the first insulating layer 172 (relative to the substrate 101 being a base reference level).

The lower sacrificial spacer layer 168 is illustrated in FIG. 7, but example embodiments thereof are not limited thereto. In some other example embodiments, the lower sacrificial spacer layer 168 may be disposed in a lower portion of the air-gap spacer 169.

Figure 8:
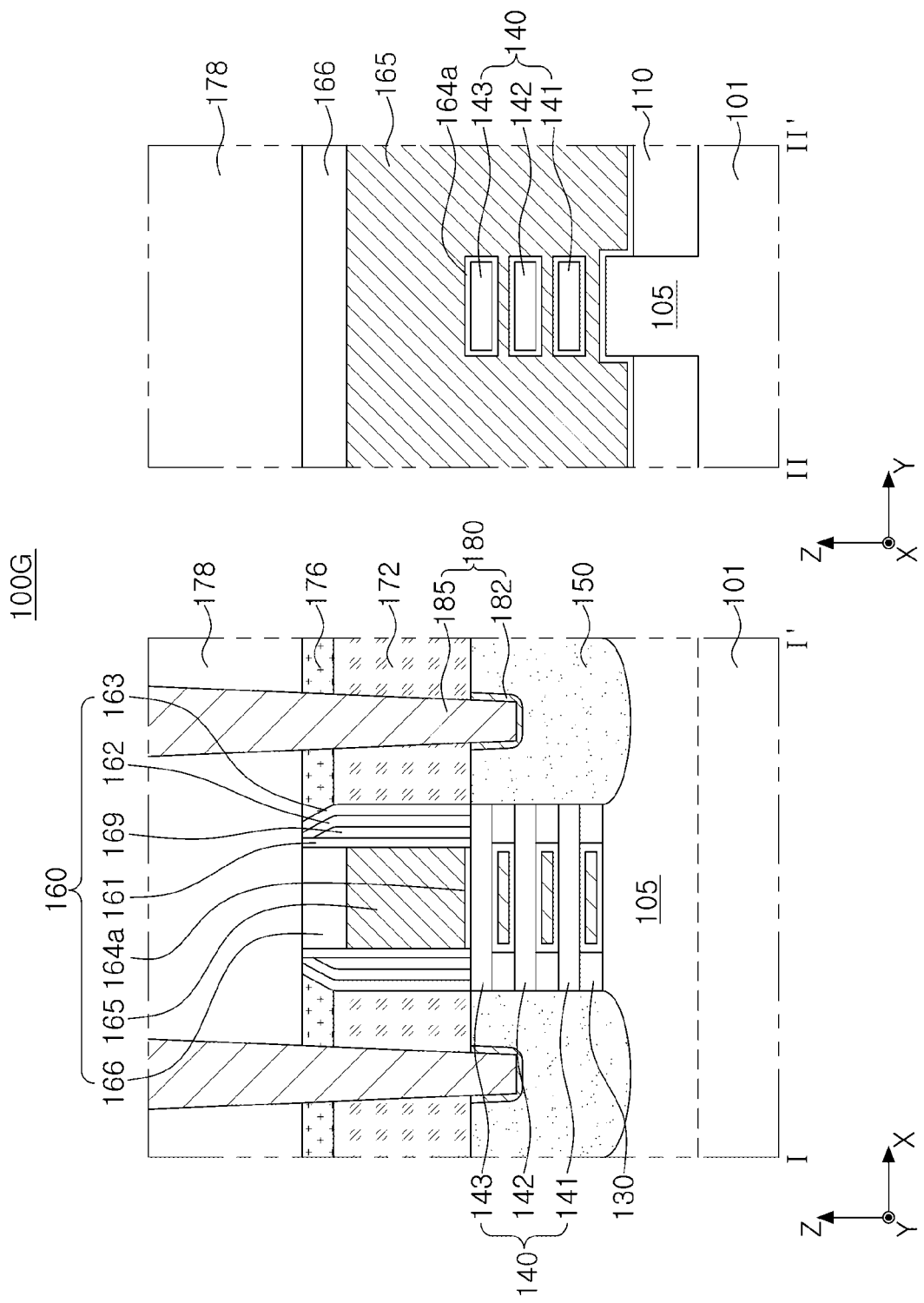
FIG. 8 is a cross-sectional diagram illustrating a semiconductor device according to example embodiments of the present inventive concept.

FIG. 8 is a cross-sectional diagram illustrating a semiconductor device taken along lines I-I' and II-II' of FIG. 1 according to an example embodiment.

Referring to FIG. 8, a semiconductor device 100G may include channel structures 140 including a plurality of channel layers 141, 142, and 143 vertically disposed on an active region 105 and spaced apart from each other. In the semiconductor device 100G, the active region 105 may have a fin structure, and the gate electrode 165 may be disposed between the active region 105 and the channel structure 140 and among a plurality of channel layers 141, 142, and 143 of the channel structures 140, and may be disposed in an upper portion of the channel structure 140. Accordingly, the semiconductor device 100G may be configured as a multi bridge channel FET (MBCFET™) formed by the channel structures 140, source/drain regions 150, and gate structures 160.

The gate structure 160 may intersect the active region 105 and the channel structures 140 and may extend in the y direction in the active region 105 and on upper portions of the channel structures 140. Channel regions of transistors may be formed in the active region 105 and the channel structures 140 intersecting the gate structure 160. The gate structure 160 may include a gate electrode 165, a gate dielectric layer 164a between the gate electrode 165 and the plurality of channel layers 141, 142, and 143, a plurality of spacers 161, 162, 163, and 169 on side surfaces of the gate electrode 165, and a gate capping layer 166 on an upper surface of the gate electrode 165. The gate electrode 165 may be in and at least partially fill a region among the plurality of channel layers 141, 142, and 143 and may extend to an upper portion of the channel structure 140 on an upper portion of the active region 105. The gate electrode 165 may surround the plurality of channel layers 141, 142, and 143. The gate electrode 165 may be spaced apart from the plurality of channel layers 141, 142, and 143 by the gate dielectric layer 164a.

Internal spacers 130 may be disposed side by side with the gate electrode 165 between the channel structures 140. The gate electrode 165 may be spaced apart from and electrically separated from the source/drain regions 150 by the internal spacers 130 in a lower portion of the third channel layer 143. A side surface of the internal spacers 130 in physical contact with the gate electrode 165 may have a rounded shape, curved inwardly towards the gate electrode 165, but example embodiments thereof are not limited thereto. The internal spacers 130 may comprise an oxide, a nitride, and/or an oxide nitride, and may be formed of a low-k film.

The channel structure 140 may include first to third channel layers 141, 142, and 143, two or more channel layers spaced apart from one another in a direction perpendicular to an upper surface of the active region 105, in the z direction, for example, on the active region 105. The first to third channel layers 141, 142, and 143 may be connected to the source/drain region 150 and may be spaced apart from an upper surface of the active region 105. Each of the first to third channel layers 141, 142, and 143 may have a width the same as or similar to a width of the active region 105 in the y direction, and may have a width the same as or similar to a width of the gate structure 160 in the x direction. In example embodiments, each of the first to third channel layers 141, 142, and 143 may have a reduced width, such that side surfaces thereof may be disposed in a lower portion of the gate structure 160 in the x direction.

The first to third channel layers 141, 142, and 143 may comprise a semiconductor material. For example, the first to third channel layers 141, 142, and 143 may include silicon (Si), silicon-gallium (SiGe), and/or germanium (Ge). The first to third channel layers 141, 142, and 143 may comprise the same material as that of the substrate 101. In example embodiments, the first to third channel layers 141, 142, and 143 may include an impurity region disposed adjacent to the source/drain regions 150. The number and shapes of the first to third channel layers 141, 142, and 143 included in a single channel structure 140 may vary in example embodiments. For example, in example embodiments, the channel structure 140 may further include a channel layer disposed on an upper surface of the active region 105.

FIGS. 9 to 15 are diagrams illustrating processes of methods of manufacturing a semiconductor device according to example embodiments.

Among example processes for manufacturing a fin-type transistor (FinFET), example processes before forming an air-gap spacer will now be described. A trench, which defines the active region 105, may be formed by patterning the substrate 101. A process for configuring the active region 105 to protrude on the substrate 101 by burying the trench using an insulating material and partially removing a portion of the insulating material may be performed, thereby forming a device separation layer 110. First and second sacrificial layers 264 and 265, first to third preliminary spacers 261, 262, and 263, and a sacrificial spacer 268, intersecting the active region 105 and extending thereacross, may be formed. A recess may be formed by selectively removing the active region 105 on both sides of the third preliminary spacer 263, and source/drain regions 150 may be formed on the recessed active region 105.

Figure 9:
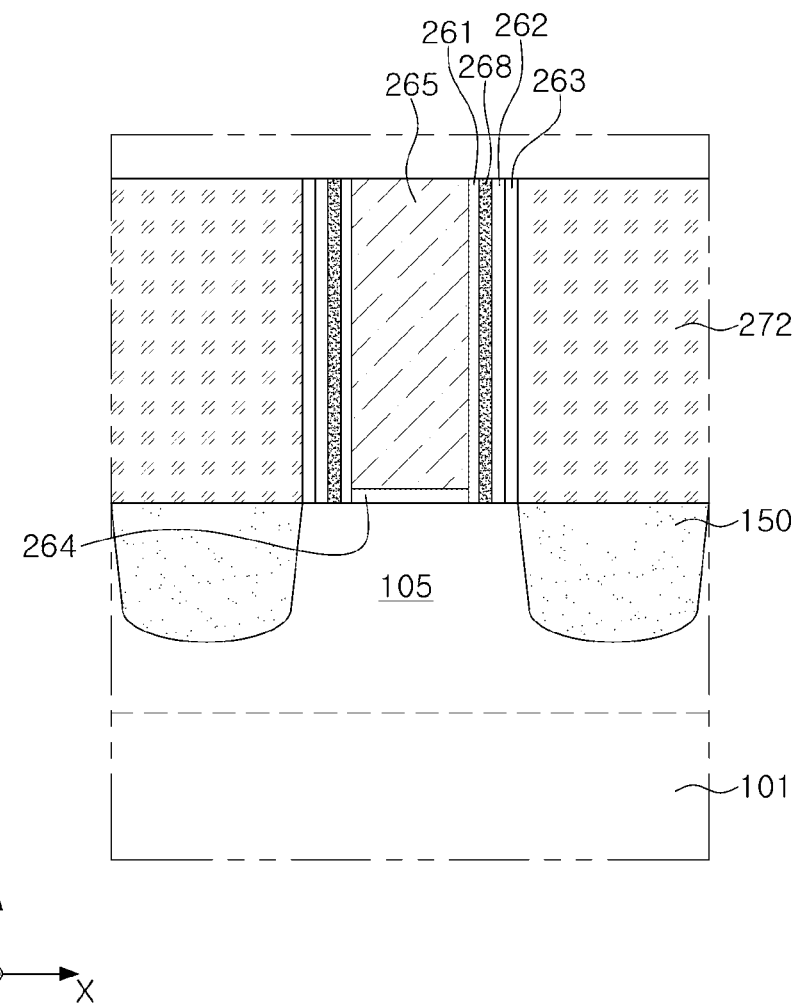
FIGS. 9 to 15 are diagrams illustrating processes of a method of manufacturing a semiconductor device according to example embodiments of the present inventive concept.
Figure 10A:
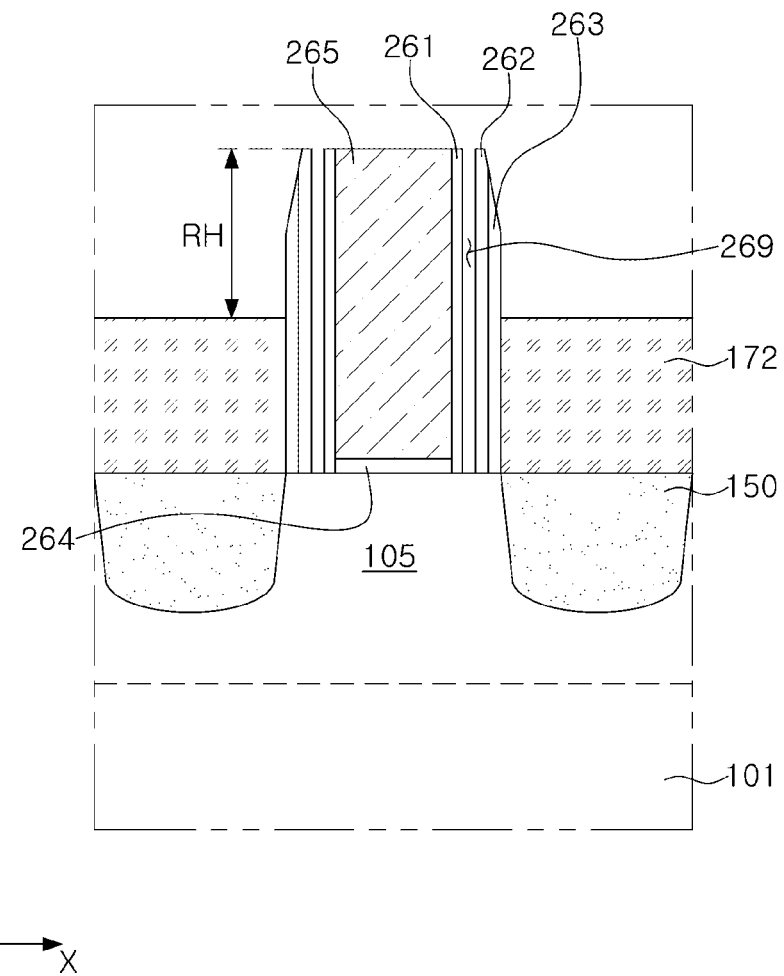

Referring to FIGS. 9 and 10A, a first preliminary insulating layer 272 may be formed on the source/drain regions 150 and a planarization process may be performed thereon. Upper portions of the first to third preliminary spacers 261, 262, and 263, the second sacrificial layer 265, the sacrificial spacer 268, and the first preliminary insulating layer 272 may be substantially coplanar with one another. The sacrificial spacer 268 may include a material layer having a density lower than a density of the first preliminary insulating layer 272, and may be formed of a material having etching selectivity with respect to the first to third preliminary spacers 261, 262, and 263.

A recess having a designed depth may be formed by removing portions of the sacrificial spacer 268 and the first preliminary insulating layer 272.

The sacrificial spacer 268 may be removed through selective etching using a wet etching process with respect to the first to third preliminary spacers 261, 262, and 263. As the sacrificial spacer 268 is removed, a preliminary air-gap 269 may be formed between the first preliminary spacer 261 and the second preliminary spacer 262. The sacrificial spacer 268 may include a material layer having a density lower than a density of the first preliminary insulating layer 272, such that an etching speed of the sacrificial spacer 268 may be greater than that of the first preliminary insulating layer 272, and, accordingly, etched depths thereof may be different.

The first preliminary insulating layer 272 may also be selectively etched with respect to the first to third preliminary spacers 261, 262, and 263 by using a wet-etching process, such that the first preliminary insulating layer 272 may be removed in greater amounts in a downward direction than an upper surface of the second sacrificial layer 265 by a designed depth. As the first preliminary insulating layer 272 is removed by a recess height RH, a first insulating layer 172 may be formed. In a subsequent process, the recess height RH may be configured based on a desired height of the gate electrode. A height of the air-gap spacer may also be configured based on the recess height RH.

Figure 10B:
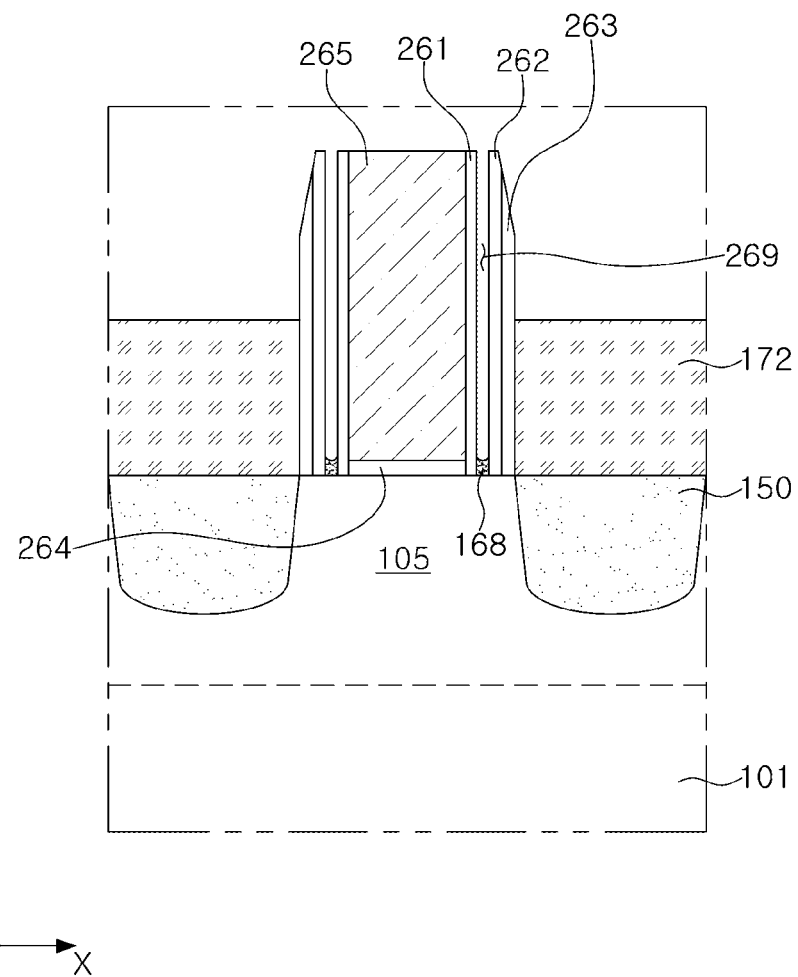

Referring to FIG. 10B, a lower portion of the sacrificial spacer 268 may not be removed by the etching process and may remain, thereby forming a lower sacrificial spacer layer 168. A central portion of the lower sacrificial spacer layer 168 may be etched further than portions of the lower sacrificial spacer layer 168 adjacent to side surfaces of each of the first and second preliminary spacers 261 and 262. The lower sacrificial spacer layer 168 may have a rounded shape, curved inwardly towards the substrate 101.

Figure 11:
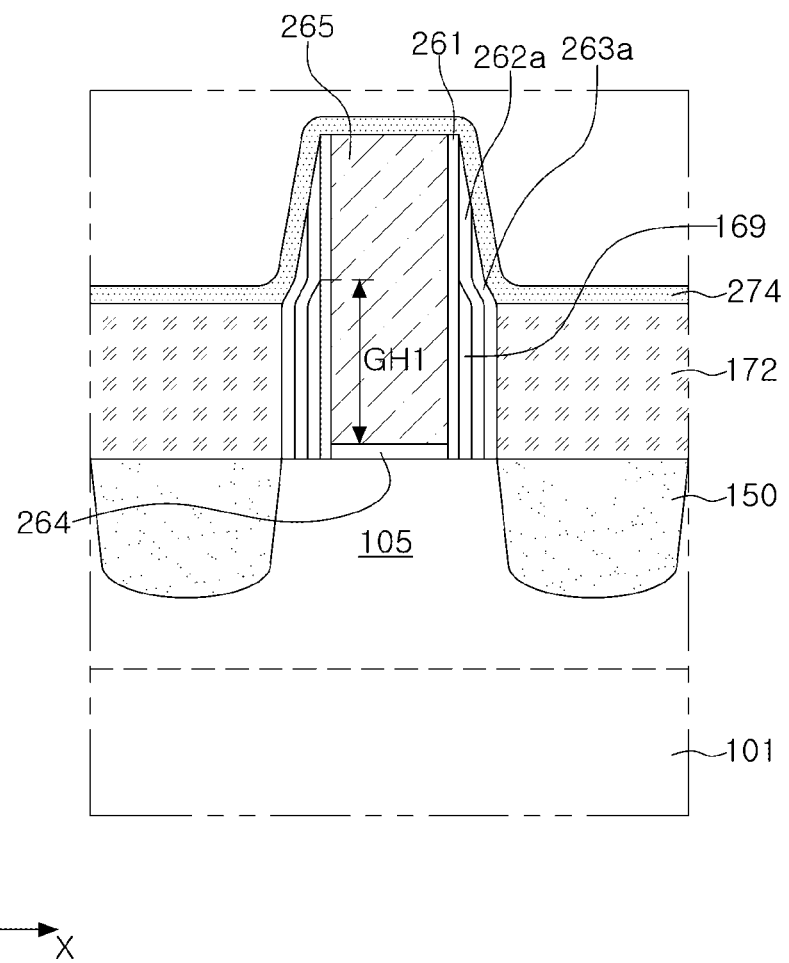

Referring to FIG. 11, a preliminary liner layer 274 may be formed to cap an air-gap spacer 169 by bending a second preliminary spacer 262a and a third preliminary spacer 263a towards a first preliminary spacer 261.

The preliminary liner layer 274 may be on and at least partially cover a first insulating layer 172, first to third preliminary spacers 261, 262, and 263, and a second sacrificial layer 265, and may be formed conformally. The second and third preliminary spacers 262a and 263a may be bent towards the first preliminary spacer 261 from a level the same as an upper surface of the first insulating layer 172. The second preliminary spacer 262a may be in physical contact with one region of the first preliminary spacer 261s disposed at a first gate height GH1 from an upper surface of the first sacrificial layer 264. The preliminary liner layer 274 may be configured as a compressive layer formed based on one or more process variations, such as, but not limited to, a deposition temperature, a deposition time, a deposition method, a material, a density of a material, and the like.

In some example embodiments, as the air-gap spacer 169 may be capped by the preliminary liner layer 274 without an additional deposition process for forming a capping layer for capping the air-gap spacer 169, fabrication process complexity and costs may be reduced. When the air-gap spacer 169 is capped through an additional deposition process for forming the capping layer, it may be difficult to maintain a constant or consistent shape of the air-gap spacer 169, but in some example embodiments, as the preliminary liner layer 274 is formed generally uniformly, the air-gap spacer 169 may have a generally uniform structure. When the preliminary liner layer 274 is a compressive layer, a device structure may be maintained so as to not externally expose the air-gap spacer 169, and capping stability may improve.

In some other example embodiments, the air-gap spacer 169 may be capped by forming a second insulating layer without performing the process for forming the preliminary liner layer 274, and the second insulating layer may be formed by forming the preliminary liner layer 274 and removing the preliminary liner layer 274, but example embodiments thereof are not limited thereto.

Figure 12:
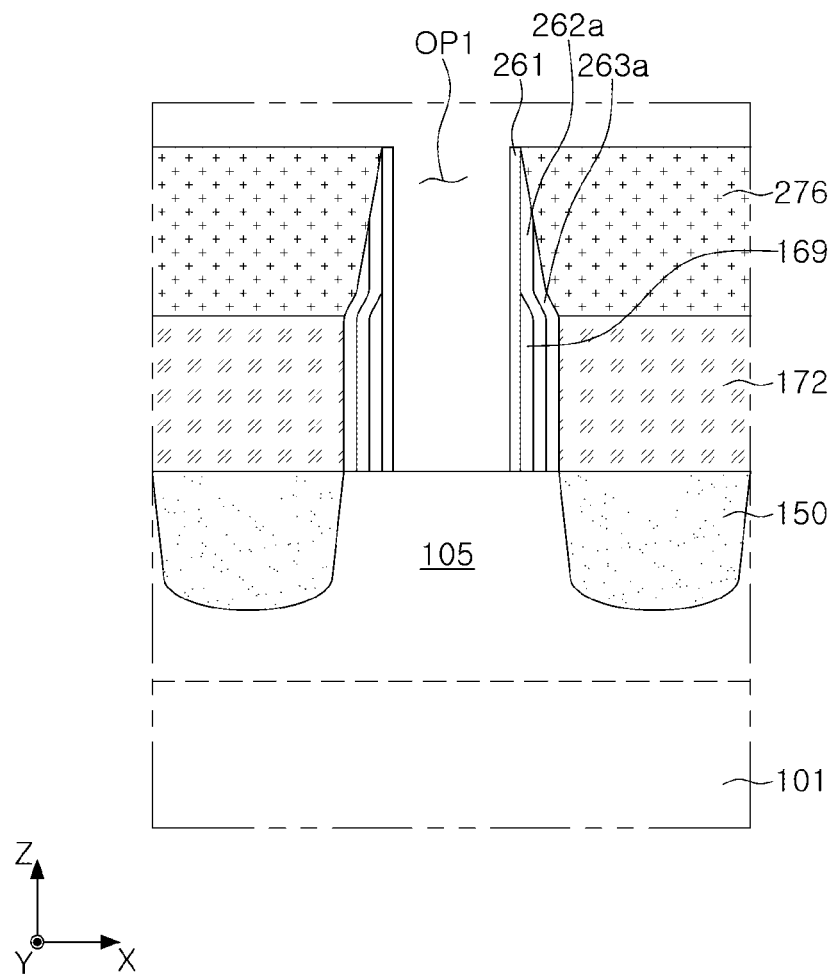

Referring to FIG. 12, the second preliminary insulating layer 276 may be formed and a planarization process may be performed, and thereafter, the first and second sacrificial layers 264 and 265 may be removed, thereby forming a first opening OP1.

The second preliminary insulating layer 276 may be formed on and may at least partially cover the first insulating layer 172 and the second sacrificial layer 265, and a planarization process may be performed. The planarization process may be performed until an upper surface of the second sacrificial layer 265 is exposed or free of the preliminary liner layer 274. In some example embodiments, before forming the second preliminary insulating layer 276, the preliminary liner layer 274 may be removed.

The first and second sacrificial layers 264 and 265, sacrificial gate structures, may be removed. The first and second sacrificial layers 264 and 265 may be selectively removed with respect to device separation layers 110 and the active region 105, disposed in a lower portion, thereby forming the first opening OP1 exposing the device separation layers 110 and the active region 105 so that they are at least partially free of layers thereon. The process for removing the first and second sacrificial layers 264 and 265 may include a dry etching process and/or a wet etching process.

In other example embodiments, the second preliminary insulating layer 276 may be on and at least partially cover the preliminary liner layer 274. The second preliminary insulating layer 276 may be formed on and to at least partially cover an upper portion of the preliminary liner layer 274 disposed on the second sacrificial layer 265, and a planarization process may be performed until an upper surface of the second sacrificial layer 265 is exposed, such that a portion thereof may be removed.

Figure 13:
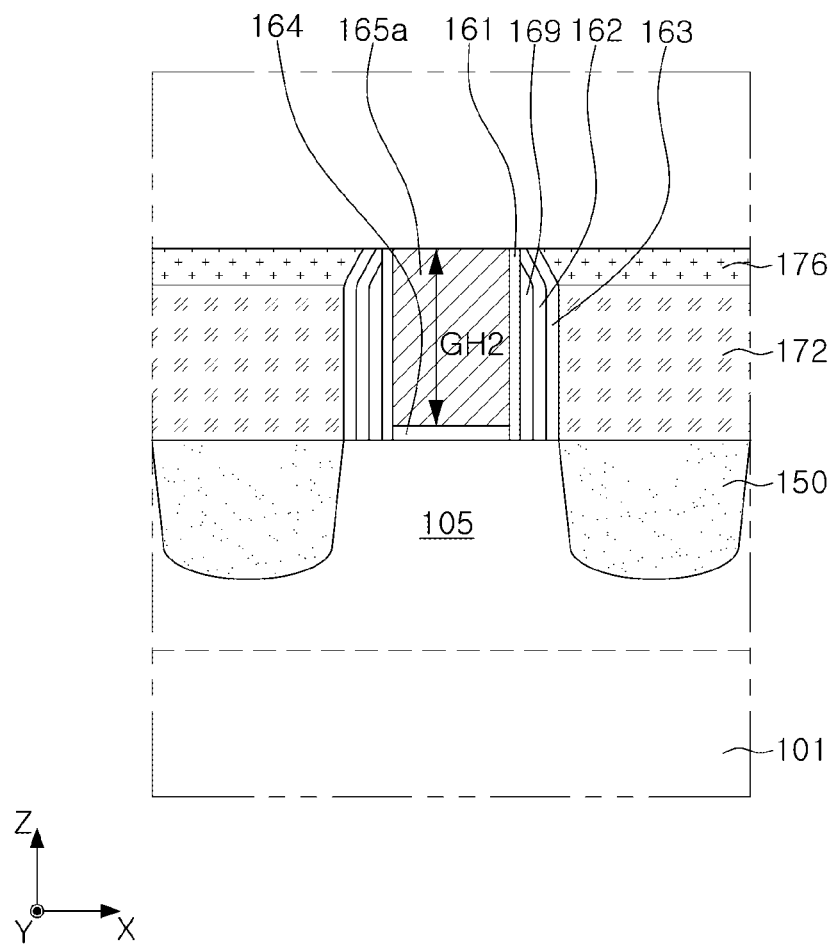

Referring to FIG. 13, a gate dielectric layer 164 and a preliminary gate electrode 165a may be formed in the first opening OP1.

The gate dielectric layer 164 may be formed conformally along a lower surface of the first opening OP1. The gate dielectric layer 164 may include an oxide, a nitride, an oxide nitride, and/or a high-k material. The preliminary gate electrode 165a is in and may completely fill an internal space of the first opening OP1 on the gate dielectric layer 164. The preliminary gate electrode 165a may include a metal and/or a semiconductor material.

After forming the gate dielectric layer 164 and the preliminary gate electrode 165a, the preliminary gate electrode 165a may be planarized so as to have a second gate height GH2 in the z direction from the gate dielectric layer 164. The second preliminary insulating layer 276 may also be planarized, and the second insulating layer 176 may be formed. An upper surface of the second insulating layer 176 may be substantially coplanar with an upper surface of the preliminary gate electrode 165a. An upper surface of the second insulating layer 176 may be substantially coplanar with an upper surface of the first spacer 161, an upper surface of the second spacer 162, and an upper surface of the third spacer 163. An upper surface of the preliminary gate electrode 165a may be disposed on a level higher than at least a region in which the air-gap spacer 169b is capped (relative to the substrate 101 being a base reference level). Referring to FIG. 11, the second gate height GH2 may be higher than the first gate height GH1 (relative to the substrate 101 being a base reference level).

Figure 14:
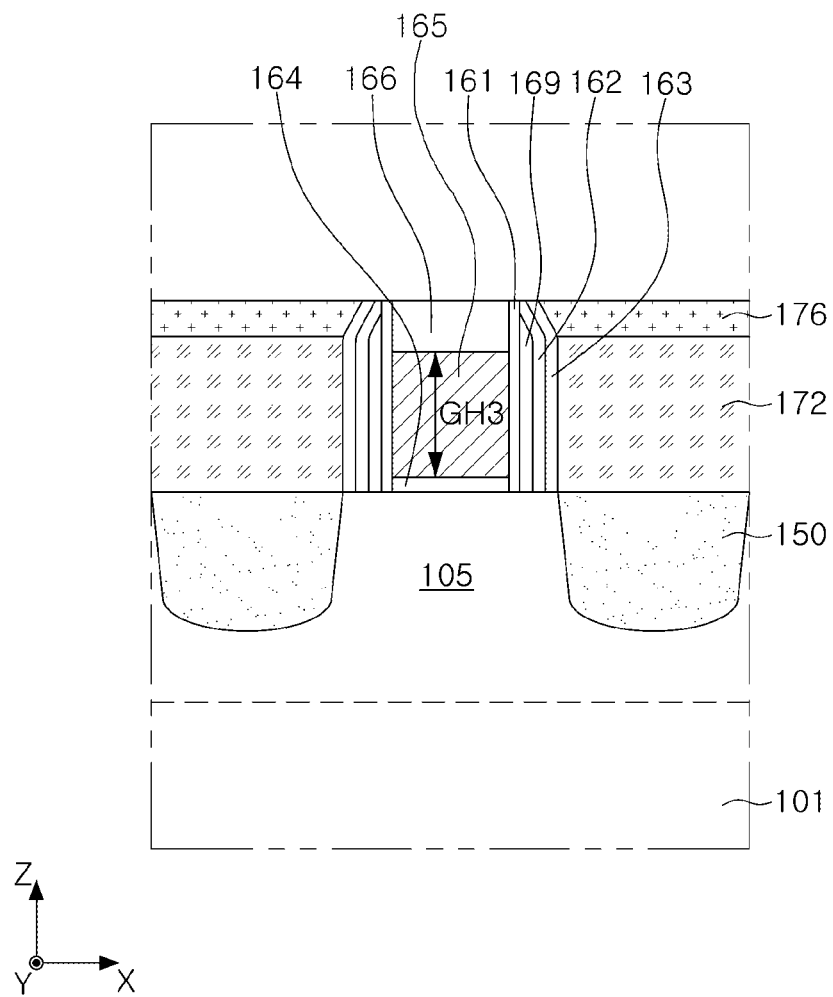

Referring to FIG. 14, an upper portion of the preliminary gate electrode 165a may be removed down to a designed depth, such that a gate electrode 165 may be formed. A gate capping layer 166 may be formed in a region from which the preliminary gate electrode 165a was removed.

The gate electrode 165 may have a third gate height GH3. The third gate height GH3 may vary based on a recess height RH (see FIG. 10A), and a height of the gate electrode 165 may be configured to be lower than the first gate height GH1 of the gate electrode in which the air-gap spacer 169 is capped by adjusting the recess height RH (relative to the substrate 101 being a base reference level).

As described in the above described example embodiments with reference to FIG. 2C, the gate capping layer 166 may have tensile stress and may apply compressive stress to the plurality of spacers 161, 162, 163, and 169. For example, the gate capping layer 166 may comprise a nitride having tensile stress.

Figure 15:
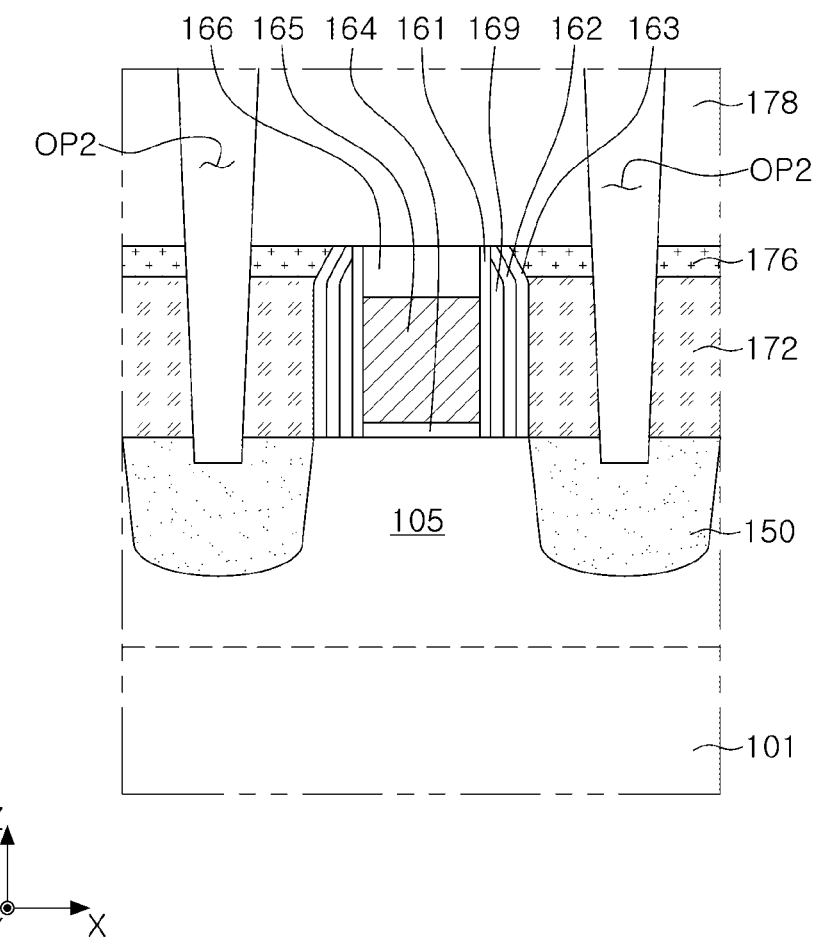

Referring to FIG. 15, the third insulating layer 178 may be formed on and to at least partially cover the gate capping layer 166 and the second insulating layer 176, and a second opening OP2 penetrating the first to third insulating layers 172, 176, and 178 may be formed. Referring back to FIG. 2A, contact plugs 185 may be formed.

The second opening OP2 may be formed by patterning the third insulating layer 178, and the contact plugs 185 may be formed by at least partially filling the second opening OP2 with a conductive material. A lower surface of the second opening OP2 may be recessed into the source/drain regions 150, or may have a curved portion along an upper surface of each of the source/drain regions 150. In different example embodiments, the shape and the dispositional form of the contact plugs 185 may be varied.

According to the above described example embodiments, by controlling the structures of a spacer and an air-gap spacer of a gate structure, a semiconductor device having improved electrical properties may be provided.

While the example embodiments have been shown and described above, it will be apparent to those skilled in the art that modifications and variations could be made without departing from the scope of the present inventive concept as defined by the appended claims.

What is claimed is:

1. A method of manufacturing a semiconductor device, the method comprising:
   forming an active region protruding from a substrate and extending in a first direction;
   forming a sacrificial gate structure on the active region and extending a second direction perpendicular to the first direction;
   forming a first spacer, a second spacer, and a sacrificial spacer between the first spacer and the second spacer on at least one side of the sacrificial gate structure;
   forming a recess region by removing a portion of the active region on the at least one side of the sacrificial gate structure;
   forming a source/drain region on the recess region;
   forming a first insulating layer on the source/drain region;
   forming an air-gap spacer by removing the sacrificial spacer with respect to the first spacer and the second spacer;
   forming a liner layer on the first insulating layer and the second spacer so that an upper portion of the second spacer is bent towards an upper portion of the first spacer to cap the air-gap spacer;
   removing the liner layer;
   forming a second insulating layer on the first insulating layer and the second spacer;
   forming a gap region by removing the sacrificial gate structure; and
   forming a gate structure by depositing a gate dielectric layer, a gate electrode, and a gate capping layer in the gap region.

2. The method of claim 1, wherein the upper portion of the second spacer is in physical contact with the upper portion of the first spacer on a contact surface, and
   wherein a lowermost end of the contact surface is on a level higher than an upper surface of the gate electrode with the substrate being a reference base level.

3. The method of claim 1, wherein a width in the first direction of an upper portion of the air-gap spacer is less than a width in the first direction of a lower portion of the air-gap spacer.

4. The method of claim 1, further comprising forming a third spacer on an external side surface of the second spacer after forming the second spacer, and
   wherein an upper portion of the third spacer is bent towards the upper portion of the second spacer.

5. The method of claim 4, wherein each of the first spacer, the second spacer, and the third spacer is formed of at least one of SiC, SiN, SiO, SiCN, SiOC, and SiOCN.

6. The method of claim 1, wherein the second insulating layer has a density greater than a density of the first insulating layer.

7. The method of claim 1, wherein the second insulating layer is a compressive layer formed of silicon oxide with high density oxide to protect from opening of an upper portion of the air-gap spacer.

8. The method of claim 1, further comprising performing a planarization process before forming the gap region, and
   wherein an upper surface of the first spacer, an upper surface of the second spacer, and an upper surface of the gate capping layer are substantially coplanar with each other.

9. The method of claim 1, wherein the second insulating layer is in contact with an upper surface of the first spacer and an upper surface of the sacrificial gate structure.

10. The method of claim 1, wherein in forming the air-gap spacer, a lower portion of the sacrificial spacer is remained as a lower sacrificial spacer.

11. The method of claim 1, wherein the second insulating layer has a first portion in parallel to an upper surface of the substrate and an extended second portion bent from the first portion to cover an upper surface of the second spacer.

12. A method of manufacturing a semiconductor device, the method comprising:
   forming a sacrificial gate structure on a substrate;
   forming a spacer structure on sides of the sacrificial gate structure; and
   forming an insulating structure on sides of the spacer structure,
   wherein forming the spacer structure comprises:
      forming first spacers on the sides of the sacrificial gate structure;
      forming sacrificial spacers on external sides of the first spacers;
      forming second spacers on external sides of the sacrificial spacers; and
      forming air-gap spacers by removing the sacrificial spacers with respect to the first spacers and the second spacers,
   wherein forming the insulating structure comprises:
      forming a first insulating layer on the sides of the spacer structure after forming the second spacers;
      forming a liner layer on the first insulating layer after forming the air-gap spacers so that an upper portion of each of the second spacers is bent towards an upper portion of each of the first spacers;
      removing the liner layer; and
      forming a second insulating layer on the first insulating layer.

13. The method of claim 12, wherein the liner layer is formed to extend onto an upper surface of the sacrificial gate structure while the air-gap spacer is capped by the second spacer and the liner layer.

14. The method of claim 12,
wherein the second insulating layer horizontally overlaps the upper portion of the second spacers, and
wherein an oxygen content in the second insulating layer is greater than an oxygen content in the first insulating layer.

15. The method of claim 12, wherein the liner layer has a first portion in parallel to an upper surface of the substrate and an extended second portion bent from the first portion to cover an upper surface of the second spacers.

16. The method of claim 12, further comprising:
forming recess regions in the substrate on both sides of the sacrificial gate structure before forming the insulating structure;
forming source/drain regions on the recess regions;
forming a gap region by removing sacrificial gate structure; and
forming a gate structure by depositing a gate dielectric layer, a gate electrode, and a gate capping layer in the gap region.

17. The method of claim 16, wherein the upper portion of the second spacer is in physical contact with the upper portion of the first spacer on a contact surface, and
wherein a lowermost end of the contact surface is on a level higher than an upper surface of the gate electrode with the substrate being a reference base level.

18. The method of claim 16, wherein an upper surface of the gate capping layer, upper surfaces of the first spacers, and upper surfaces of the second spacers are substantially coplanar with each other.

19. A method of manufacturing a semiconductor device, the method comprising:
forming an active region on a substrate;
forming a sacrificial gate structure on the active region;
forming a spacer structure including a first spacer, a second spacer, and an air-gap spacer between the first spacer and the second spacer;
forming source/drain regions on the active region and on both sides of the sacrificial gate structure;
forming an insulating structure on the sides of the spacer structure and the source/drain regions;
forming a liner layer on the insulating structure and the second spacer so that the upper portion of the second spacer is bent toward the upper portion of the first spacer to cap the air gap spacer;
removing the liner layer;
forming a gap region by removing the sacrificial gate structure; and
forming a gate structure by depositing a gate dielectric layer, a gate electrode, and a gate capping layer in the gap region,
wherein the upper portion of the second spacer is in physical contact with the upper portion of the first spacer on a contact surface,
wherein a lowermost end of the contact surface is on a level higher than an upper surface of the gate electrode with the substrate being a reference base level, and
wherein an uppermost end of the air-gap spacer is on a level higher than the upper surface of the gate electrode with the substrate being a reference base level.

20. The method of claim 19, wherein the insulating structure comprises a first region and a second region on the first region,
wherein the second region horizontally overlaps the upper portion of the second spacers, and
wherein an oxygen content in the second region is greater than an oxygen content in the first region.

* * * * *